United States Patent [19]

Miyajima et al.

[11] Patent Number: 5,427,843
[45] Date of Patent: Jun. 27, 1995

[54] CERAMIC-COATED METAL SHEET

[75] Inventors: Shumpei Miyajima; Wataru Ito; Misao Hashimoto, all of Kawasaki; Isao Ito, Tokyo, all of Japan

[73] Assignee: Nippon Steel Corporation, Tokyo, Japan

[21] Appl. No.: 270,789

[22] Filed: Jul. 5, 1994

Related U.S. Application Data

[63] Continuation of Ser. No. 938,570, Aug. 31, 1992, abandoned, which is a continuation of Ser. No. 579,027, Sep. 7, 1990, abandoned.

[30] Foreign Application Priority Data

Sep. 8, 1989 [JP] Japan .................. 1-231765

[51] Int. Cl.⁶ .......................................... C23C 14/06
[52] U.S. Cl. .................................. 428/216; 428/457; 428/469; 428/472; 428/698; 428/701; 428/702
[58] Field of Search ............... 428/216, 457, 469, 472, 428/698, 701, 702

[56] References Cited

U.S. PATENT DOCUMENTS

| | | | |
|---|---|---|---|
| 3,406,043 | 10/1968 | Balde | 428/472 |
| 3,837,896 | 9/1974 | Lindstrom | 428/336 |
| 3,958,070 | 5/1976 | Schintlmeister et al. | 428/457 |
| 4,098,956 | 7/1978 | Blickensderfer et al. | 428/469 |
| 4,226,082 | 10/1980 | Nishida | 427/38 |
| 4,252,862 | 2/1981 | Nishida | 428/457 |
| 4,284,687 | 8/1981 | Dreyer | 428/469 |
| 4,401,719 | 8/1983 | Kobayashi et al. | 428/472 |
| 4,480,010 | 10/1984 | Sasanuma et al. | 428/457 |
| 4,533,605 | 8/1985 | Hoffman | 428/216 |
| 4,556,607 | 12/1985 | Sastri | 428/627 |
| 4,640,869 | 2/1987 | Loth | 428/698 |
| 4,702,955 | 10/1987 | Allred | 428/701 |
| 4,763,601 | 8/1988 | Saida et al. | 118/718 |
| 4,962,612 | 10/1990 | Kuwano | 52/588 |
| 5,079,089 | 1/1992 | Ito et al. | 428/469 |

FOREIGN PATENT DOCUMENTS

| | | |
|---|---|---|
| 58-64380 | 4/1983 | Japan . |
| 2083842 | 3/1982 | United Kingdom . |

OTHER PUBLICATIONS

Hashimoto et al "Surface Modification of Stainless Steels by In-line Dry Coating Technology" Surf. & Coat. Tech., 36(1988) pp. 837-845.
Buhl et al "TiN coatings on steel" Thin Solid Films, 80 (1981) pp. 265-270.

*Primary Examiner*—Archene Turner
*Attorney, Agent, or Firm*—Wenderoth, Lind & Ponack

[57] ABSTRACT

A ceramic single layer-coated metal sheet having an excellent decorative property and a high weatherability, which comprises a metal substrate and a transparent ceramic layer formed on the metal substrate by a dry process such as physical vapor deposition or chemical vapor deposition, said transparent ceramic layer having a thickness of 0.05 to 5 μm and a refractive index in the visible region of at least 2.0. A ceramic multiple layer-coated metal sheet having an excellent decorative property and a high weatherability is also disclosed, which further comprises a colored ceramic layer between the substrate and the transparent ceramic layer, the first layer being formed of at least one member selected from the group consisting of nitrides, carbides and carbonitrides of at least one element selected from the group consisting of Ti, Zr, Hf, Cr, Nb and Al and having a thickness of 0.1 to 1 μm.

7 Claims, No Drawings

CERAMIC-COATED METAL SHEET

This application is a continuation of now abandoned application Ser. No. 07/938,570, filed Aug. 31, 1992, which is a continuation of now abandoned Ser. No. 07/579,027, filed Sep. 7, 1990.

BACKGROUND OF THE INVENTION

1. Field of the Invention

The present invention relates to a ceramic-coated metal sheet having an excellent decorative property and a high weatherability, which can be used as decorative materials, such as interior materials, construction materials, automobile materials and the like, even under environments where they are actually used.

2. Description of the Related Art

With development and maturation of techniques of electronics, a dry coating process such as physical vapor deposition or chemical vapor deposition has been practically utilized for the surface modification of metal materials. By dint of the progress of this technique, it has become possible to obtain ceramics-coated metal materials provided with such functions as weatherability, abrasion resistance, decorative property and far infrared characteristics, which could not be obtained by the conventional wet process represented by plating. However, this technique involves serious economical problems in that it is not suitable for mass production, the running cost is large and the apparatus is expensive. Therefore, the dry process cannot successfully replace the wet process on an industrial scale unless especially excellent performances or functions are attained.

In the field of decorative materials, gold-color decorative coating of TiN is the almost only instance of successful industrialization while reflecting the recent trend toward high-quality products. As a decorative coating substance, the color of which is utilizable, substances other than the above-mentioned TiN showing a gold color are hardly known. Accordingly, it is very difficult to provide a variety of colors, and only several colors such as gold, black and grey colors are attainable at the present.

A variety of colors can be produced by so-called interference colors, namely by utilizing the interference of light (see, for example, Japanese Patent Application No. 54-66385 and Japanese Patent Application No. 54-85214). In case of an interference color produced by an oxide or nitride of aluminum or silicon, which are customarily used, the color greatly changes according to the viewing angle, and furthermore, since the range where the hue can be controlled by changing the thickness is narrow, the usefulness of the product as a decorative article is very low.

It is an object of the present invention to provide a coated metal sheet having an excellent decorative property and a high weatherability, in which by laminating a transparent ceramic layer having a high refractive index on a metal substrate or a colored ceramics layer formed on a metal sheet, and greatly changing the hue of the metal sheet or colored ceramics, the variety of colors can be increased and the above-mentioned problem of the extreme change of color according to the viewing angle can be solved to some extent.

SUMMARY OF THE INVENTION

In accordance with the present invention, there is provided a single ceramic layer-coated metal sheet having an excellent decorative property and a high weatherability, comprising a metal substrate and a transparent ceramic layer formed on the metal substrate by a dry coating process such as physical vapor deposition or chemical vapor deposition, said transparent ceramic layer having a thickness of 0.05 to 5 $\mu$m and a refractive index in the visible light region of at least 2.0.

Furthermore, in accordance with the present invention, there is provided a multiple ceramic layer-coated metal sheet having an excellent decorative property and a high weatherability, comprising a metal substrate, a colored ceramic layer as the first layer adjacent to the substrate, which is formed of at least one member selected from the group consisting of nitrides, carbides and carbonitrides of at least one element selected from the group consisting of Ti, Zr, Hf, Cr, Nb and Al, and has a thickness of 0.1 to 1 $\mu$m, and a transparent ceramic layer as the second layer adjacent to the first layer, which is formed by a dry process such as physical vapor deposition or chemical vapor deposition and has a thickness of 0.05 to 5 $\mu$m and a refractive index in the visible light region of at least 2.0.

The excellent decorative property disclosed in the present invention can be attained only by coating a transparent ceramic layer having a high refractive index on a metal substrate or a colored ceramic layer formed as the first layer on a metal substrate, to greatly change the hue from the substance color of the metal substrate or colored ceramic.

The defect of the conventional technique, that is, the change of the color according to the viewing angle, can be eliminated to the maximum extent in the present invention, because the refraction angle of light advancing into the transparent ceramic layer having a higher refractive index is large.

Moreover, since the transparent ceramic as the second layer has a high hardness, the metal sheet can be protected from external factors (for example, a shock to the coating by gravel when the coated sheet is used for a construction material), and therefore, excellent weatherability and abrasion resistance can be realized.

As the metal substrate, there can be used stainless steel, titanium, copper, steel and aluminum, but substrates that can be used in the present invention are not limited to these metals. Since the coated sheet of the present invention is applied to a construction material or an automobile, a ribbon-shaped or coil-shaped substrate having a large area (for example, 370 mm×300 m) is preferably used.

In the case where a colored ceramic layer is formed as the first layer on the metal substrate, the colored ceramic layer is formed of at least one member selected from the group consisting of nitrides, carbides and carbonitrides of at least one element selected from the group consisting of Ti, Zr, Hf, Cr, Nb and Al. The thickness of the first layer is preferably 0.1 to 1 $\mu$m, because if the thickness is smaller than 0.1 $\mu$m, the degree of color obtained will not be sufficient, and since a sufficient color is already obtained at a thickness of up to 1 $\mu$m, the thickness need not be increased beyond 1 $\mu$m. Moreover, if the thickness of the first layer is too large, reduction of the adhesion between the first layer and the metal substrate is caused. It is especially preferable that the thickness of the first layer is 0.2 to 0.5 $\mu$m. If the thickness is 0.2 $\mu$m or more, a sufficient substance color can be obtained, and in view of the cost, it is preferred that the thickness not be greater than 0.5 $\mu$m.

The transparent ceramic layer is formed of a transparent substance having a refractive index of at least 2.0. More specifically, the transparent ceramic layer is formed of at least one member selected from the group consisting of oxides and nitrides of Ti, Zr, Hf, Th, V, Nb, Ta, W, Zn, Cd, Sn, Ba, Sb, Pb, Te and Ce, such as $TiO_2$, $Nb_2O_5$ and $ZrO_2$.

In the ceramic single layer-coated metal sheet of the present invention, the hue of the entire coated sheet is determined by the overlapping of the hue of the metal sheet as the substrate and the coloration by the interference effect of light in the transparent ceramic.

In the ceramic multiple layer-coated metal sheet of the present invention, the hue of the entire coated sheet is determined by the hue of the colored ceramic layer as the first layer and the coloration by the interference effect of light in the transparent ceramic layer.

In each case, the interference effect of light in the transparent ceramic layer causes a change of the hue, and the change of the hue by the interference effect is sharper as the refractive index of the substance of the transparent ceramic layer becomes higher.

The effect of the refractive index on the change of the hue will now be described in detail. The basic hue of the metal sheet of the present invention is determined according to the thickness of the topmost transparent ceramic layer. This is common to all transparent ceramic materials but the chroma, which is one element of the hue, that is, the sharpness, is greatly influenced by the refractive index.

In the transparent ceramic-coated metal sheet of the present invention, the majority of interference of reflected light occurs between the following two kinds of light among various reflected light originally incident on the surface of the coated metal sheet from air; namely, (1) light reflected from the surface of the transparent ceramic layer as the topmost layer and (2) light, not reflected from the topmost surface as light (1), but advancing through the transparent ceramic layer, reflected from the surface of the metal substrate or colored ceramic layer located just below the topmost layer, advancing through the transparent ceramic layer again and going out into the air. The closer the intensities of these two reflected lights (1) and (2) are to each other, the larger is the quantity of this interference.

In transparent ceramic-coated metal sheets, the intensity of reflected light (2) has generally an intensity several times to ten-odd times as high as the intensity of reflected light (1). Supposing that the refractive index of the transparent ceramic layer is n and the absorption coefficient is 0, the intensity (reflectance) of reflected light (1) is expressed by $(n-1)^2/(n+1)^2$ and becomes higher with higher n. For example, the reflectance of $SiO_2$ (average refractive index is 1.46) frequently used is about 3.5%, and that of $Nb_2O_5$ (average refractive index is 2.25) included within the scope of the present invention is about 15%.

The influence of the refractive index of the transparent ceramic on the intensity of reflected light (2) is relatively small, and in each of the foregoing instances, the reflectance is scores of percent. Accordingly, in the case of conventional $SiO_2$, the intensity of reflected light (1) is much smaller than that of reflected light (2), and therefore, the interference is small. In contrast, in case of $Nb_2O_5$ used in the present invention, since the intensities of reflected lights (1) and (2) are brought close to each other, a large interference effect is caused. Generally, if the refractive index of the transparent ceramic is at least 2.0, the intensity of reflected light (1) exceeds 10%, and a strong interference effect is caused.

As is seen from the foregoing description, if the refractive index of the transparent ceramic layer becomes large, the quantity of the light interference increases. In the system where the hue is manifested by the interference effect as in case of a ceramic-coated metal sheet, the larger is the interference quantity, the larger (sharper) is the chroma of the hue. Accordingly, in a metal sheet comprising a transparent ceramic film having a refractive index of at least 2.0 as the outermost layer, a sharp hue having a high chroma can be obtained.

The thickness of the transparent ceramic layer is preferably 0.05 to 5 μm. Since the basic hue is determined according to this thickness, a thickness showing a desired hue can be selected within this range. If the thickness is smaller than 0.05 μm, the change of the hue is small and the metal substrate-protecting effect is insufficient. If the thickness exceeds 5 μm, the change of the hue is small and the adhesion between the first and second layers is reduced, and good results cannot be obtained.

As the dry coating process, ion plating or sputtering is preferable for forming the colored ceramic coating. If the number of interfaces increases as in the case of a multiple-layer coating, the adhesion becomes important, and a film having a good adhesion can be coated by ion plating. In order to improve the quality of the color of the colored ceramic, it is necessary to strictly control the stoichiometric ratio of the metal such as Ti, Zr, Hf, Cr, Nb or Al to nitrogen or carbon, and by sputtering, a film having the stoichiometric ratio can be easily coated.

Accordingly, when a ceramic-coated metal sheet having a colored ceramic layer is formed, there is preferably adopted a method in which in order to increase the adhesion to the metal substrate, the portion of the first layer close to the metal substrate is coated by ion plating, and in order to strictly control the stoichiometric ratio of the metal to nitrogen or carbon and obtain a high quality color, the portion of the first layer close to the second layer is coated by sputtering.

As a conventional method for coating a metal oxide, there can be mentioned a method in which a metal alkoxide or chelate is dissolved in an alcohol solution and thermal decomposition is carried out. According to this coating method utilizing thermal decomposition, the weatherability is improved to some extent, but the formed film has a porous structure characteristic of the process and the weatherability is not sufficient. Moreover, control of the film thickness is difficult, and the production of an interference color by adjusting the film thickness is impossible.

As other methods for forming a metal oxide, there can be mentioned spraying method, roll coating method and spin coating method, but control of the film thickness is difficult in each of these methods. In view of the uniformity of the film thickness, the immersion draw-up method is preferable, but in this method, the thickness of the film is determined by the viscosity of the solution and the kind of the substrate, and control of the film thickness is difficult.

According to the present invention, appropriate dry coating processes are selected according to the kinds of films to be prepared as pointed out above, and a coated metal sheet that cannot be obtained by the conventional techniques can be provided.

For formation of the transparent ceramic coating, plasma CVD and sputtering are adopted as the process. The reason is that according to plasma CVD, a dense coating film can be formed and since scattering of light is not caused, an excellent interference transparent film can be obtained. Simultaneously, corrosion of the metal substrate by micro defects, for example, by pitting, can be prevented and the weatherability can be drastically improved. Furthermore, the above dry process is adopted since it is necessary that the refractive index of the transparent ceramic layer should be sufficiently increased and the stoichiometric ratio should be maintained between the metal element and oxygen or nitrogen.

As compared with the transparent ceramic film formed by plasma CVD, the improvement of the weatherability is poor in the film formed by sputtering, but it is still possible to impart a high weatherability, and the stoichiometric ratio is much more easily controlled in the case of sputtering. Moreover, sputtering is advantageous in that coating can be easily accomplished without using harmful substances such as silane, which is used as the starting gas in plasma CVD.

In the case where the colored ceramic is coated by ion plating or sputtering and the transparent ceramic is coated by plasma CVD or sputtering, it is preferred that the first and second layers be continuously formed in one chamber. If vacuum is removed after formation of the first layer and the second layer is formed after the sample is taken out in the open air, gas components in the air, especially oxygen gas and water, are left between the first and second layers, and hence, the interface between the first and second layers is broken and the adhesion is reduced. Furthermore, if the first and second layers are formed in separate chambers, since the temperature of the substrate is elevated and dropped, internal stress is produced in the film and increase and reduction of the internal stress are repeated. Accordingly, cracks are readily formed in the coating layer and reduction of the adhesion between the metal substrate and the first layer is caused.

EXAMPLE 1

By using continuous coating equipment in which a cleaning mechanism, an ion plating apparatus, a sputtering apparatus and a plasma CVD apparatus were arranged in series between a coil unwinding mechanism and a coil winding mechanism, TiN having a thickness of 0.6 $\mu$m as the first layer and $Nb_2O_5$ having a thickness of 0.121 $\mu$m as the second layer were continuously laminated by ion plating and sputtering, respectively, on coiled ferrite type stainless steel having a width of 370 mm, a length of 300 m and a thickness of 0.5 mm.

When the refractive index of the second layer was measured by ellipsometry and varied angle reflectometry, it was found that the average refractive index was 2.25. Prior to the laminating operation, the substrate was subjected to ion bombardment with argon gas as the undercoat treatment in a cleaning room.

The hue of the two-layer film was a much sharper yellow color different from the gold color of TiN. The film thickness of $Nb_2O_5$ was changed in the above-mentioned combination while fixing the TiN film thickness to 0.6 $\mu$m. The observed difference of the hue is summarized in Table 1. The hue was measured and calculated according to the L*a*b* color coordinate system by using a commercially available colorimeter.

For comparison, the change of the hue observed in the $SiO_2$/TiN two-layer film is shown in Table 1. The refractive index of $SiO_2$ in the visible region was about 1.46. When this comparative sample is compared with the example comprising $Nb_2O_5$, it is seen that the change of the hue is small compared with that of TiN being at the center in the comparative sample.

When a single layer of TiN was formed on the stainless steel, in the weatherability test, the weatherability was almost the same as the weatherability of the surface of the stainless steel. In contrast, in the case where $Nb_2O_5$ was coated on TiN in the above-mentioned manner, the rust-preventive life was more than 4 times as long as that of the surface of the stainless steel.

When the surface hardness was measured by a micro hardness meter comprising a triangular indenter for evaluating the scratch resistance of the surface, it was found that the surface hardness of the sample obtained in this example was 1000 kg/mm$^2$ while the surface hardness of the uncoated substrate was 270 kg/mm$^2$, and it was confirmed that the hardness was considerably increased.

EXAMPLE 2

By using continuous coating equipment in which a cleaning mechanism, an ion plating apparatus, a sputtering apparatus and a plasma CVD apparatus were arranged in series between a coil unwinding mechanism and a coil winding mechanism, TiN having a thickness of 0.6 $\mu$m as the first layer and $TiO_2$ having a thickness of 0.091 $\mu$m as the second layer were continuously laminated by ion plating and sputtering, respectively, on coiled ferrite type stainless steel having a width of 370 mm, a length of 300 m and a thickness of 0.5 mm.

When the refractive index of the second layer was measured by ellipsometry and varied angle reflectometry, it was found that the average refractive index was 2.90. Prior to the laminating operation, the substrate was subjected to ion bombardment with argon gas as the undercoat treatment in a cleaning room.

The hue of the two-layer film was a much sharper yellow color different from the gold color of TiN. The film thickness of $TiO_2$ was changed in the above-mentioned combination while fixing the TiN film thickness to 0.6 $\mu$m. The observed difference of the hue is summarized in Table 2. The hue was measured and calculated according to the L*a*b* color coordinate system by using a commercially available colorimeter.

When a single layer of TiN was formed on the stainless steel, in the weatherability test, the weatherability was almost the same as the weatherability of the surface of the stainless steel. In contrast, in the case where $TiO_2$ was coated on TiN in the above-mentioned manner, the rust-preventive life was more than 5 times as long as that of the surface of the stainless steel.

When the surface hardness was measured by a micro hardness meter comprising a triangular indenter for evaluating the scratch resistance of the surface, it was found that the surface hardness of the sample obtained in this example was 1200 kg/mm$^2$ while the surface hardness of the uncoated substrate was 270 kg/mm$^2$, and it was confirmed that the hardness was considerably increased.

EXAMPLE 3

TiC having a thickness of 0.5 $\mu$m as the first layer and $TiO_2$ having a thickness of 0.2 $\mu$m as the second layer were laminated by ion plating and sputtering, respectively, on a coiled ferrite type stainless steel having a thickness of 0.5 mm. The obtained hue was a gentle dark green color. The film thickness of $TiO_2$ was changed while fixing the film thickness of TiC to 0.5 μm in the above-mentioned combination, and the change of the hue was examined. Also in this example, a delicate change of the color was clearly manifested.

In the case where a single layer of TiC was formed, in the weatherability test, the weatherability was extremely poor and the rust-preventive life was about ½ of that of the stainless steel surface. If $TiO_2$ was further coated on TiC, the rust-preventive life was improved and the weatherability was comparable to that of the surface of the stainless steel.

EXAMPLE 4

HfN having a thickness of 0.8 μm as the first layer and $ZrO_2$ having a thickness of 001 μm as the second layer were continuously laminated by ion plating or sputtering, respectively, on a coiled ferrite type stainless steel having a thickness of 0.5 mm. When the refractive index of the second layer was measured by ellipsometry and varied angle reflectometry, it was found that the average refractive index was 2.75. The hue of the obtained two-layer film was a much sharper yellow color different from the gold color of HfN.

In the above-mentioned combination, the thickness of $ZrO_2$ was changed while fixing the thickness of HfN to 0.8 μm. The observed difference of the color is summarized in Table 3. The hue was measured and calculated according to the L*a*b* color coordinate system by using a commercially available colorimeter. As is seen from Table 3, the tendency of the change of the color in the combination of $ZrO_2$/HfN was substantially the same as the tendency observed in the combination of $ZrO_2$/HfN.

TABLE 1

Hue of $Nb_2O_5$/TiN Two-Layer Film and Film Thickness

| | $Nb_2O_5$ (A) | TiN (A) | L* | a* | b* | Apparent color (reference) |
|---|---|---|---|---|---|---|
| present invention | 1210 | about 6000 | 57.3 | −1.4 | 77.3 | sharp yellow |
| | 1520 | about 6000 | 62.2 | 0.5 | 58.9 | bright yellow |
| | 2740 | about 6000 | 63.1 | 65.2 | 47.8 | bright reddish orange |
| | 4240 | about 6000 | 63.5 | 7.4 | 61.1 | dense yellow |
| | 7980 | about 6000 | 61.1 | −16.3 | 47.5 | sharp yellowish green |
| comparison | 0 | about 6000 | 65.8 | 0.5 | 27.4 | light gold (TiN) |
| | $SiO_2$ (A) | TiN (A) | L* | a* | b* | |
| | 1250 | about 6000 | 64.9 | −5.6 | 28.9 | greenish yellow |
| | 2040 | about 6000 | 62.2 | 8.0 | 18.8 | orange |

Film-Forming Conditions
TiN: evaporation of Ti and simultaneous introduction of Ar + $N_2$ (reactive ion plating)
$Nb_2O_5$: introduction of Ar + $O_2$ to Nb target (reactive sputtering)
$SiO_2$: introduction of Ar to quartz glass target (ordinary sputtering)
substrate: SUS 430BA sheet (not heated)

TABLE 2

Hue of $TiO_2$/TiN Two-Layer Film and Film Thickness

| | $TiO_2$ (A) | TiN (A) | L* | a* | b* | Apparent color (reference) |
|---|---|---|---|---|---|---|
| present invention | 910 | about 6000 | 58.6 | −1.0 | 78.4 | sharp yellow |
| | 1250 | about 6000 | 62.0 | 0.8 | 56.9 | bright yellow |
| | 2040 | about 6000 | 61.2 | 45.2 | 37.8 | bright reddish orange |
| | 3000 | about 6000 | 63.6 | 7.2 | 63.0 | dense yellow |
| | 5970 | about 6000 | 61.1 | −21.3 | 37.5 | sharp yellowish green |
| comparison | 0 | about 6000 | 65.8 | 0.5 | 27.4 | light gold (TiN) |

Film-Forming Conditions
TiN: evaporation of Ti and simultaneous introduction of Ar + $N_2$ (reactive ion plating)
$TiO_2$: introduction of Ar + $O_2$ to Ti target (reactive sputtering)
substrate: SUS 430BA sheet (not heated)

TABLE 3

Hue of $ZrO_2$/HfN Two-Layer Film and Film Thickness

| | $ZrO_2$ (A) | HfN (A) | L* | a* | b* | Apparent color (reference) |
|---|---|---|---|---|---|---|
| present invention | 1060 | about 8000 | 63.6 | −1.4 | 77.0 | sharp yellow |
| | 1450 | about 8000 | 69.5 | 0.3 | 38.7 | bright yellow |
| | 2360 | about 8000 | 55.2 | 31.6 | 18.1 | reddish orange |
| | 3490 | about 8000 | 61.7 | 0.0 | 62.1 | dense yellow |
| | 6930 | about 8000 | 58.9 | −15.4 | 38.1 | yellowish green |
| comparison | 0 | about 8000 | 62.3 | 2.1 | 32.4 | light gold (HfN) |

We claim:

1. A ceramic multiple layer-coated metal sheet having an excellent decorative property and a high weatherability, which comprises a metal substrate, a colored ceramic layer as a first layer on and adjacent to the substrate, which is formed of at least one member selected from the group consisting of nitrides, carbides and carbonitrides of at least one element selected from the group consisting of Ti, Zr, Hf, Cr, Nb and Al and has a thickness of 0.1 to 1 μm, and a transparent ceramic layer as a second layer on and adjacent to the first layer, which is formed by a dry process and has a thickness of 0.05 to 5 μm and a refractive index in the visible light region of at least 2.75, and wherein said transparent ceramic layer exhibits an interference effect of light in said transparent ceramic layer which causes a change of hue of said coated metal sheet.

2. A sheet according to claim 1, wherein said metal sheet is a ribbon rolled in the form of a coil.

3. A sheet according to claim 1, wherein said metal sheet is a decorative material used for an interior material, a construction material or an automobile material.

4. A sheet according to claim 1, wherein said transparent ceramic layer is made of at least one member selected from the group consisting of oxides and nitrides of at least one element selected from the group consisting of Ti, Zr, Hf, Th, V, Nb, Ta, W, Zn Cd, Sn, Ba, Sb, Pb, Te, and Ce.

5. A sheet according to claim 4, wherein said transparent ceramic layer is made of one member selected from the group consisting of $TiO_2$, $Nb_2O_5$ and $ZrO_2$.

6. A sheet according to claim 1, wherein said first layer is a layer deposited by ion plating and said second layer is a layer deposited by sputtering.

7. A sheet according to claim 1, wherein said dry process is physical vapor deposition or chemical vapor deposition.

* * * * *